United States Patent
Tsuji

(10) Patent No.: US 7,315,202 B2
(45) Date of Patent: Jan. 1, 2008

(54) PULSE-WIDTH MODULATION AMPLIFIER AND SUPPRESSION OF CLIPPING THEREFOR

(75) Inventor: Nobuaki Tsuji, Hamamatsu (JP)

(73) Assignee: Yamaha Corporation, Hamamatsu-shi (JP)

(*) Notice: Subject to any disclaimer, the term of this patent is extended or adjusted under 35 U.S.C. 154(b) by 94 days.

(21) Appl. No.: 11/172,137

(22) Filed: Jun. 30, 2005

(65) Prior Publication Data
US 2006/0008095 A1    Jan. 12, 2006

(30) Foreign Application Priority Data
Jul. 2, 2004  (JP)  ............ P 2004-197347
Jul. 2, 2004  (JP)  ............ P 2004-197385

(51) Int. Cl.
*H03F 3/38* (2006.01)
(52) U.S. Cl. ................................. 330/10; 330/251
(58) Field of Classification Search ............. 330/10, 330/251, 207 A
See application file for complete search history.

(56) References Cited

U.S. PATENT DOCUMENTS 7,142,050 B2 * 11/2006 Risbo ............ 330/10

FOREIGN PATENT DOCUMENTS

JP   4-38566    9/1992
JP   3130919   11/2000

* cited by examiner

*Primary Examiner*—Benny Lee
*Assistant Examiner*—Hieu Nguyen
(74) *Attorney, Agent, or Firm*—Pillsbury Winthrop Shaw Pittman LLP

(57) ABSTRACT

A pulse-width modulation (PWM) amplifier is adapted to a class-D amplifier in which an analog input signal is subjected to integration, pulse-width modulation, and switched amplification, wherein a glitch elimination circuit eliminates noise from a pulse-width modulated signal, from which a high pulse signal and a low pulse signal are isolated such that each pulse is delayed by a dead time at the leading-edge timing thereof. When both of them are simultaneously set to a high level, one of them is reduced in level. In response to the occurrence of clipping, an integration constant applied to an operational amplifier is automatically changed from a primary integration constant to a secondary integration constant. When the clipped state is sustained for a prescribed time, an inversion pulse is compulsorily introduced into the pulse-width modulated signal.

12 Claims, 7 Drawing Sheets

PULSE-WIDTH MODULATION AMPLIFIER AND SUPPRESSION OF CLIPPING THEREFOR

BACKGROUND OF THE INVENTION

1. Field of the Invention

This invention relates to pulse-width modulation (PWM) amplifiers used for power amplification of audio signals, wherein clipping is suppressed so as to avoid deterioration of waveforms.

This application claims priority on Japanese Patent Applications Nos. 2004-197347 and 2004-197385, the contents of which are incorporated herein by reference.

2. Description of the Related Art

Conventionally, pulse-width modulation (PWM) effected on large-amplitude signals may cause clipping, which in turn causes partial loss of waveforms (e.g., flattening or partial distortion of waveforms) reproduced based on pulse-width modulated signals. Japanese Examined Utility Model Publication No. H04-38566 teaches a technology for the prevention of partial loss of waveforms due to clipping occurring in pulse-width modulation, wherein clipping is canceled by compulsorily introducing pulses upon the detection of a clipped state.

FIG. 4 is a block diagram showing a conventionally known class-D amplifier using pulse-width modulation, wherein an input terminal 301 receives an analog input signal. A PWM circuit 302 converts the analog input signal into a pulse-width. modulated signal (or a PWM signal), which is then supplied to a drive circuit 304 via an OR circuit 303. The drive circuit 304 outputs a control signal to a switch $SW_1$ via a capacitor C301 for blocking dc components. The PWM signal is also delivered to a drive circuit 306 via an AND circuit 305. The drive circuit 306 outputs a control signal to a switch $SW_2$ via a capacitor C302 for blocking dc components. In accordance with switching operations of the switches $SW_1$ and $SW_2$, the PWM signal is subjected to switched amplification, so that an amplified PWM signal is supplied to a pulse-analog decoding circuit 308, where it is decoded into an analog output signal, which is then output to an output terminal 309.

A pulse interval detection circuit 310 normally monitors the PWM signal input into the pulse-analog decoding circuit 308. An output signal of the pulse interval detection circuit 310 is supplied to a second input terminal of the AND circuit 305 and is also supplied to a second input terminal of the OR circuit 303 via an inverter 307.

When clipping does not occur in the PWM signal, the output signal of the pulse interval detection circuit 310 remains at a high level, so that the OR circuit 303 and the AND circuit 305 directly transmit the PWM signal to the drive circuits 304 and 306 respectively.

When clipping occurs in the PWM signal so that its level may be maintained at a high level or a low level for a while, the pulse interval detection circuit 310 switches over the output signal thereof from the high level to the low level at a prescribed timing, at which both of the outputs of the OR circuit 303 and AND circuit 305 are inverted. Thus, a pulse (or pulses) is compulsorily introduced into the PWM signal to be supplied to the switches $SW_1$ and $SW_2$. This creates ac components in the input signals of the switches $SW_1$ and $SW_2$, whereby switched amplification can be maintained.

Japanese Patent No. 3130919 teaches a technology for the prevention of clipping in which an analog input signal having large amplitude is reduced to half in level. In this technology, an instantaneous voltage of an analog input signal is detected by a voltage level detection circuit so that when it matches source voltage, a pulse-width modulation (PWM) amplifier is switched over into an anti-clipping mode from a normal mode, whereby the gain of a pre-amplification circuit, which is arranged prior to the PWM amplifier, is reduced to half while voltage applied to a switched amplification stage is doubled; thus, it is possible to avoid the occurrence of clipping.

Clipping may depend upon the level of the analog input signal; that is, the level of the analog input signal may not be so high that the clipped state of a waveform may become discontinuous, or the clipped state occurs sporadically, which is shown in FIGS. 5C and 5D. When a secondary integration component is introduced into the circuitry in order to improve noise characteristics with respect to the analog input signal, there may occur a phenomenon in which clipped states occur per every other pulse in a stable manner, which is shown in FIGS. 5A and 5B.

In the technology disclosed in Japanese Patent No. 3130919, the circuit operation may be interrupted or become unstable when it is switched over into the anti-clipping mode or returned to the normal mode. This causes distortion of an output waveform. In the anti-clipping mode, the analog input signal is processed with half of the 'normal' source voltage, which may deteriorate noise characteristics. In particular, these problems may apparently occur when 'relatively small' clipping occurs in waveforms.

In addition, the aforementioned technology requires a specially-designed power source circuit, which can produce double voltage that is double the normal voltage produced by the normal power source circuit, which may increase the overall scale of the power source system. Such a power source circuit providing double voltage is used only in the anti-clipping mode, which certainly reduces the overall power use efficiency.

In the technology disclosed in Japanese Examined Utility Model Publication No. H04-38566, pulses are compulsorily introduced into PWM signals, which may cause disturbance in a closed loop realizing feedback from the latter stage to the former stage with respect to the PWM circuit. Such disturbance causes distortion of an output waveform, which apparently appears in the case of relatively small clipping.

When an analog input signal has an excessive amplitude so that positive voltage (or negative voltage) is continuously applied to the circuitry, the capacitor C301 or C302 must be excessively charged, and this causes trouble in the decoding operation. It is necessary to avoid the occurrence of this situation.

When pulses are simultaneously introduced into the drive circuits 304 and 306 due to error operation, which may occur due to noise, a relatively large current may be forced to flow instantaneously between a positive voltage $+V_{PX}$ and a negative voltage $-V_{MX}$, so that the power source circuit (not shown) and the switches $SW_1$ and $SW_2$ may likely be destroyed. It is necessary to avoid the occurrence of this situation.

SUMMARY OF THE INVENTION

It is an object of the present invention to provide a pulse-width modulation (PWM) amplifier used for the power amplification of audio signals and the like, which can reliably prevent an excessive current from flowing through a switched amplification stage due to operation error caused by noise between positive voltage and negative voltage. Herein, the PWM amplifier has various advantages in which the power source circuit and other circuits are not necessarily increased in scale so as not to reduce the power use efficiency; it is possible to avoid the occurrence of trouble in the decoding operation due to excessive input signal being continued; anti-clipping processing does not interrupt pulse-width modulation, which is thus not interrupted in processing; it is possible to reduce influence on a closed loop, which realizes feedback from the latter stage to the former stage with respect to a PWM circuit, during the anti-clipping processing; hence, it is possible to avoid deterioration of the quality of an output waveform produced by the PWM amplifier.

In a first aspect of the invention, a pulse-width modulation amplifier in which an analog input signal is subjected to pulse-width modulation and is then subjected to switched amplification is designed to include a holding circuit for holding a pulse-width modulated signal, and a control circuit for controlling the holding circuit to invert the output thereof when the pulse-width modulated signal is inverted in level and is sustained at the inverted level for a prescribed time. Thus, it is possible to eliminate unwanted pulses causing noise; and it is possible to prevent a current from directly flowing through a switched amplification stage between the positive voltage and negative voltage.

In the above, it is possible to further include a clipped state detection circuit for detecting a clipped state with respect to the pulse-width modulated signal, and a compulsory pulse introducing circuit for compulsorily introducing an inversion pulse whose pulse width is longer than the prescribed time into the pulse-width modulated signal when the clipped state is detected. Thus, it is possible to avoid failure of the decoding operation irrespective of the continuous input of large-amplitude signals.

In addition, it is possible to further include an integrator for integrating the analog input signal prior to the pulse-width modulation, a clipping detection circuit for detecting the occurrence of clipping in the pulse-width modulation, and an integration constant changeover circuit for automatically changing over the integration constant adapted to the integrator to be reduced in order. This reliably cancels relatively small clipped states. Hence, it is possible to continuously perform pulse-width modulation without discontinuity; it is possible to reduce influence on a closed loop realizing feedback from the latter stage to the former stage of a pulse-width modulation circuit; it is possible to effectively suppress distortion occurring in the output waveform due to anti-clipping processing; and it is therefore possible to improve the quality of the output waveform.

Furthermore, it is possible to further include a pulse isolation circuit for isolating a high pulse signal and a low pulse signal from the pulse-width modulated signal output from the holding circuit, wherein each of pulses included in the high pulse signal and low pulse signal is delayed at the leading-edge timing thereof by a dead time. This reliably prevents a current from directly flowing through the switched amplification stage between the positive voltage and negative voltage.

Moreover, it is possible to further include an adjuster for compulsorily turning off one of the high pulse signal and the low pulse signal which are simultaneously set at a prescribed level. This reliably prevents a current from directly flowing through the switched amplification stage between the positive voltage and negative voltage irrespective of failure of the former stage of the pulse-width modulation circuit.

In a second aspect of the invention, a clipping suppression circuit adapted to a pulse-width modulation amplifier in which an analog input signal is subjected to integration, pulse-width modulation, and switched amplification, is designed to include a clipping detection circuit for detecting the occurrence of clipping in the pulse-width modulation; and an integration constant changeover circuit for changing over an integration constant to be reduced in order upon detection of the occurrence of clipping.

In the above, the clipping suppression circuit can be designed to include a clipping detection circuit for monitoring a pulse width produced by the pulse-width modulation so as to determine the occurrence of clipping when the pulse width exceeds a threshold; and an integration constant changeover circuit for changing over an integration constant to be reduced in order.

Furthermore, the clipping suppression circuit can be designed to include a monitoring circuit for monitoring inversion of a pulse-width modulated signal in synchronization with a half period of a carrier wave; a clipping detection circuit for determining the occurrence of clipping when no inversion occurs in the pulse-width modulated signal during one and a half periods of the carrier wave; and an integration constant changeover circuit for changing over an integration constant to be reduced in order upon detection of the occurrence of clipping.

Thus, it is possible to avoid the occurrence of a slightly clipped state by reducing the order of an integration constant upon the detection of clipping; hence, it s possible to continue pulse-width modulation without interruption; it is possible to greatly reduce influence on a closed loop realizing feedback from the latter stage to the former stage of the PWM circuit; and it is possible to effectively suppress distortion of an output waveform, which may be caused by anti-clipping processing, so that the output waveform can be improved in quality.

The aforementioned circuit configuration can be simply realized by changing over the integration constant adapted to the 'existing' integrator included in the class-D amplifier without increasing the scale of the circuitry.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
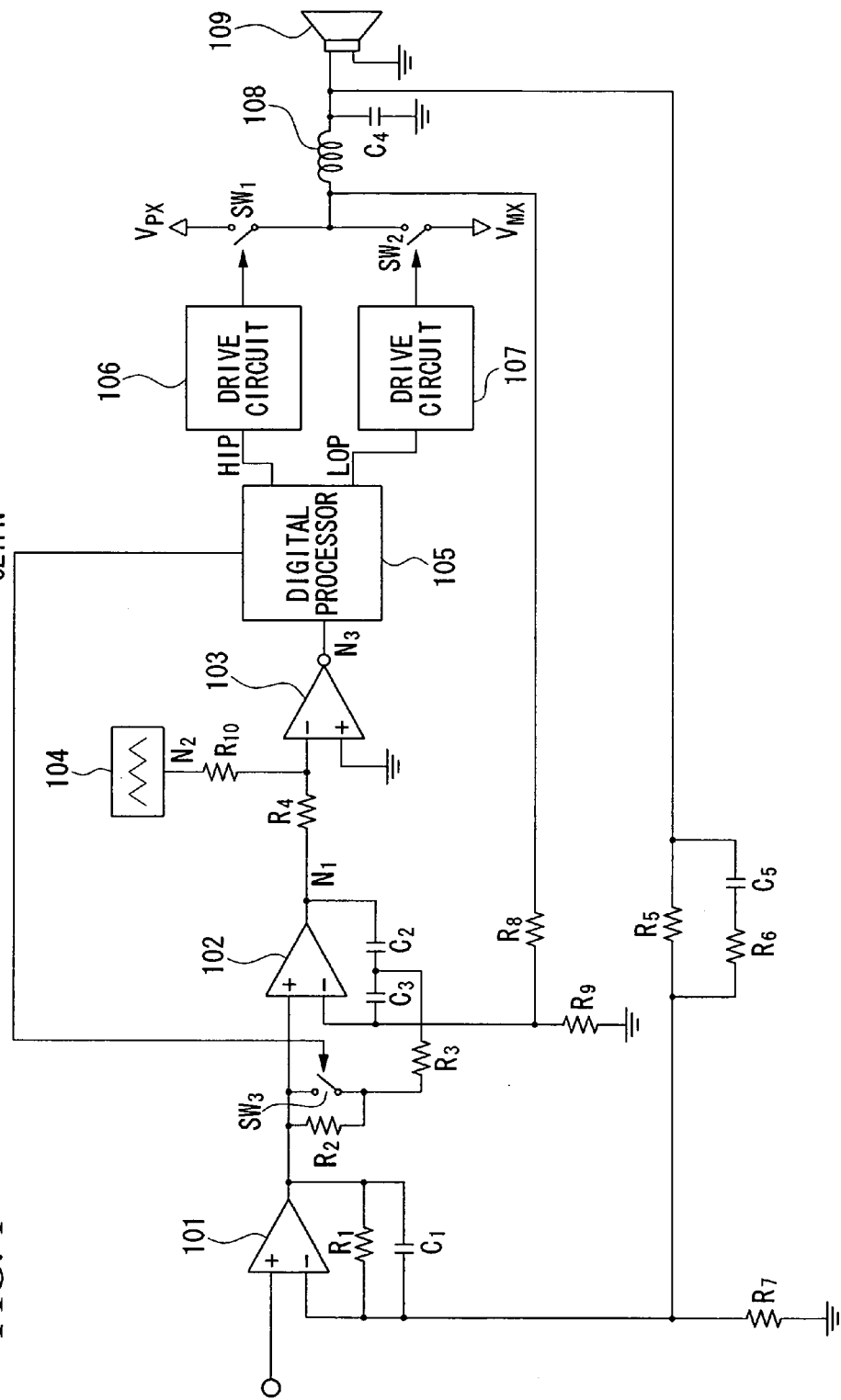
FIG. 1 is a block diagram showing the overall constitution of a class-D amplifier using pulse-width modulation in accordance with a first embodiment of the invention.

FIG. 1 is a block diagram showing the overall constitution of a class-D amplifier using pulse-width modulation in accordance with a first embodiment of the invention.

Reference numeral 101 designates an operational amplifier whose non-inverting input terminal is connected to an input terminal receiving an analog input signal. A resistor $R_1$ is connected between the inverting input terminal and output terminal of the operational amplifier 101. A capacitor $C_1$ is connected between the inverting input terminal and output terminal of the operational amplifier 101.

Reference numeral 102 designates an operational amplifier whose non-inverting input terminal is connected to the output terminal of the operational amplifier 101. Capacitors $C_2$ and $C_3$ are connected in series and are inserted between the inverting input terminal and output terminal of the operational amplifier 102. A resistor $R_3$ and a switch $SW_3$ are connected in series and are inserted between the non-inverting input terminal of the operational amplifier 102 and the connection point between the capacitors $C_2$ and $C_3$. A resistor $R_2$ is connected in parallel with the switch $SW_3$. The aforementioned elements combined with the operational amplifier 102 form an integration circuit, wherein the integration constant thereof is switched over between a primary integration constant (corresponding to first-order integration characteristics) and a secondary integration constant (corresponding to second-order integration characteristics) in response to on/off operations of the switch $SW_3$.

Reference numeral 103 designates a comparator that forms a part of a pulse-width modulation (PWM) circuit, wherein the inverting input terminal of the comparator 103 is connected to the output terminal $N_1$ of the operational amplifier 102 via a resistor $R_4$ and is also connected to an output terminal $N_2$ of a triangular wave generating circuit 104 via a resistor $R_{10}$. The triangular wave generating circuit 104 generates a triangular wave $N_2$ whose level periodically and linearly increases and decreases with respect to 0V. The non-inverting input terminal of the comparator 103 is grounded. That is, pulse-width modulation is performed by comparing the addition result, which is produced by adding the integration output $N_1$ and the triangular wave output $N_2$ together, with ground potential. Incidentally, it is possible to partially modify the circuitry in such a way that the triangular wave output $N_2$ is connected to the non-inverting input terminal of the comparator 103.

A digital processor 105 performs prescribed processing on a pulse-width modulated signal (or a PWM signal) $N_3$ output from the comparator 103, wherein the PWM signal $N_3$ is divided into a high level portion and a low level portion so as to produce a high pulse signal HIP and a low pulse signal LOP. In addition, the digital processor 105 also produces an on/off signal CLIPN and sends it to the switch $SW_3$.

A drive circuit 106 drives a switch $SW_1$ in response to the high pulse signal HIP; and a drive circuit 107 drives a switch $SW_2$ in response to the low pulse signal LOP. The switches $SW_1$ and $SW_2$ operate based on positive voltage $V_{PX}$ and negative voltage $V_{MX}$ so as to realize a switched amplification stage.

A coil 108 and a capacitor $C_4$ form a low-pass filter (LPF), which demodulates the PWM signal supplied thereto via the switch $SW_1$ or $SW_2$ so as to reproduce an analog output signal. Reference numeral 109 designates a load to which the analog output signal is applied.

A resistor $R_8$ is inserted between the output terminal of the switched amplification stage, which is constituted by the switches $SW_1$ and $SW_2$, and the inverting input terminal of the operational amplifier 102. A resistor $R_9$ is connected between the inverting input terminal of the operational amplifier 102 and the ground. A feedback value of the PWM signal, which is subjected to switched amplification and is then fed back to the operational amplifier 102, depends on the ratio between the resistors $R_8$ and $R_9$.

A resistor $R_5$ is inserted between the output terminal (outputting the analog output signal) and the inverting input terminal of the operational amplifier 101. A resistor $R_6$ and a capacitor $C_5$ are connected in series and are connected in parallel with the resistor $R_5$. A resistor $R_7$ is connected between the inverting input terminal of the operational amplifier 101 and the ground. A feedback value of the analog output signal, which is fed back to the operational amplifier 101, depends on the ratio between the resistors $R_5$ and $R_7$.

In order to improve the operation of the circuitry in terms of noise and waveform distortion, the operational amplifier 101 performs pre-amplification on the analog input signal. The operational amplifier 101 performs level correction based on the feedback value of the analog output signal. The operational amplifier 102 is combined with the capacitors $C_2$ and $C_3$ and the resistor $R_3$ to form an integrator. The switch $SW_3$ is normally turned on, so that the integrator including the operational amplifier 102 provides the secondary integration constant.

Figure 2:
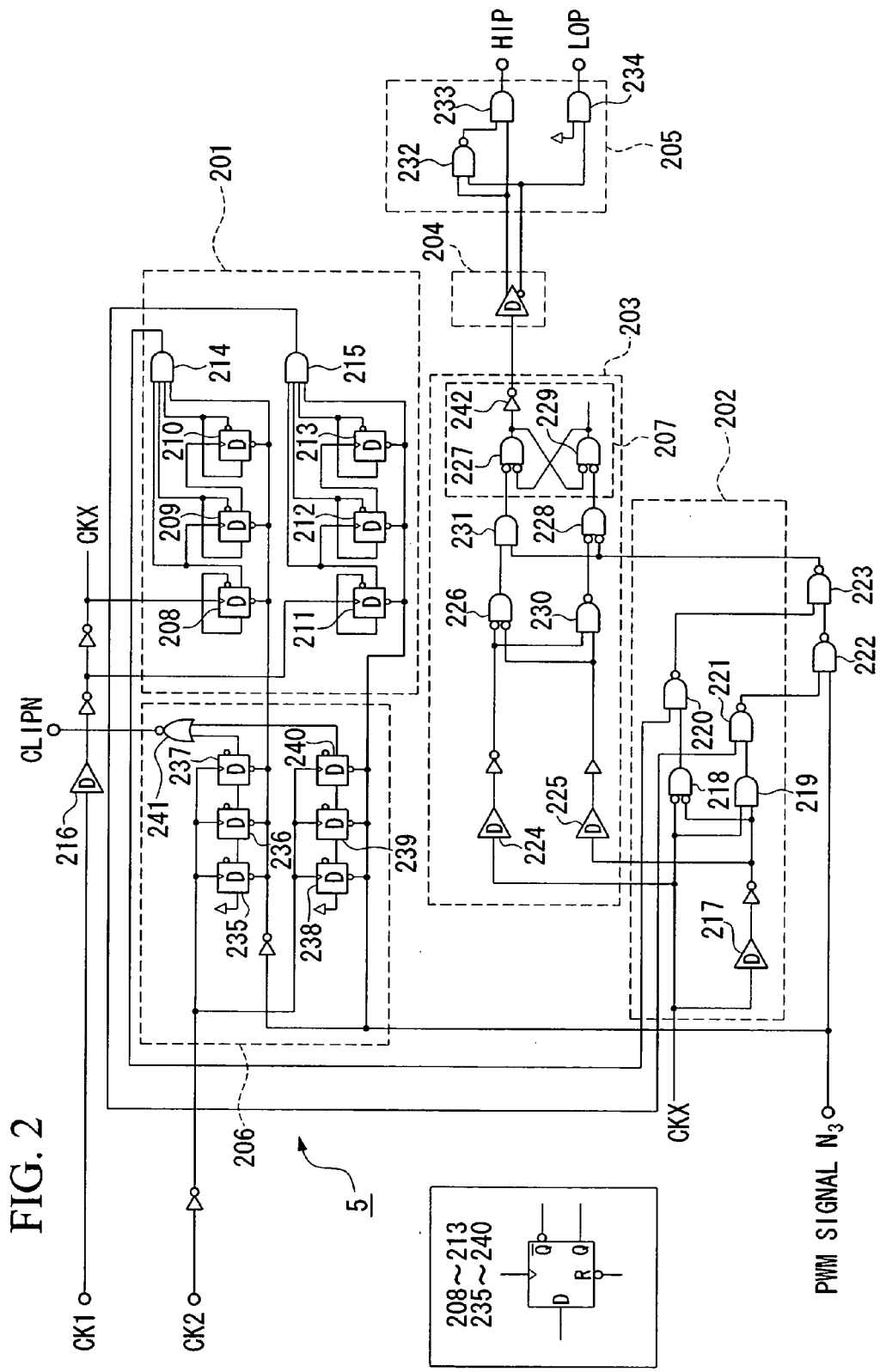
FIG. 2 is a circuit diagram showing the detailed constitution of the digital processor 105 shown in FIG. 1.

FIG. 2 is a circuit diagram showing the detailed constitution of the digital processor 105 shown in FIG. 1. Reference numeral 201 designates a clipped state detection circuit that detects that a clipped state is present in response to the PWM signal $N_3$ so as to produce a clipped state detection signal. Reference numeral 202 designates a pulse generation circuit that generates pulses, which are introduced into the PWM signal $N_3$, in response to the clipped state detection signal. Reference numeral 203 designates a glitch elimination circuit that eliminates noise from the PWM signal $N_3$. Reference numeral 204 designates a pulse isolation circuit that isolates the high pulse signal HIP and the low pulse signal LOP from the PWM signal $N_3$, wherein each pulse is processed such that a prescribed dead time is subtracted from the leading-edge timing thereof. Reference numeral 205 designates an adjusting circuit for making adjustment with respect to ON states in which both of the high pulse signal HIP and the low pulse signal LOP are ON. Reference numeral 206 designates a clipping detection circuit that detects clipping from the PWM signal $N_3$ so as to output on/off signals to the output terminal CLIPN. On/off signals at the output terminal CLIPN are supplied to the switch $SW_3$.

The clipped state detection circuit 201 is constituted by D flip-flops 208 to 213 whose reset terminals are set to "low active" states, and AND circuits 214 and 215. The PWM signal $N_3$ is supplied to the reset terminals of the D flip-flops 211-213, while the PWM signal $N_3$ is inverted and is then supplied to the reset terminals of the D flip-flops 208-210. Reference numeral 216 designates a delay circuit that delays a clock pulse signal CK1 by a prescribed delay time so as to produce a clock pulse signal CKX. The clock pulse signal CK1 is used for the generation of the triangular wave $N_2$ in the triangular wave generating circuit 104 shown in FIG. 1, wherein it contains a string of pulses that occur in synchronization with the triangular wave $N_2$. By delaying the clock pulse signal CK1, it is possible to generate the clock pulse signal CKX containing pulses in synchronization with the PWM signal $N_3$. The delayed clock pulse signal CK1 is inverted and is then supplied to the D flip-flops 211-213; and it is further inverted and is then supplied to D flip-flops 208-210 as the clock pulse signal CKX.

The D flip-flops 208-210 and the AND circuits 214 form a counter, which upon reception of the clock pulse signal CKX, counts low-level periods included in the PWM signal $N_3$ at the leading-edge timing of the clock pulse signal CKX, wherein when seven low-level periods are consecutively counted, the AND circuit 214 changes the output thereof from low level (L) to high level (H). When low-level periods of the PWM signal $N_3$ further continue, the AND circuit 214 outputs high level (H) per every eight periods of the clock pulse signal CKX. Similarly, the D flip-flops 211-213 and the AND circuit 215 form a counter, which counts clipped states with respect to high-level periods of the PWM signal $N_3$, wherein when seven high-level periods are consecutively counted, the AND circuit 215 changes the output thereof from low level (L) to high level (H). When high-level periods further continue, the AND circuit 215 outputs the low-level per every eight periods. Furthermore, when high-level periods of the PWM signal $N_3$ further continue, the AND circuit 215 outputs high level (H) per every eight periods of the clock pulse signal CKX.

The pulse generation circuit 202 includes a delay circuit 217, an AND circuit 218 whose input terminal is set to a low active state, an AND circuit 219, and NAND circuits 220-221. The delay circuit 217 realizes a dead time delay. The AND circuits 218-219 and the NAND circuits 220-221 operate to generate pulses, which are used to compulsorily invert the PWM signal $N_3$ in level. These pulses are introduced into the PWM signal $N_3$ by way of NAND circuits 222 and 223.

That is, the delay circuit 217 determines widths of pulses to be incorporated into the PWM signal $N_3$ when the clipped state continues at high level or at low level. In addition, it prevents set and reset inputs of an RS flip-flop 207 from being simultaneously set to a high level.

In the glitch elimination circuit 203, reference numerals 224 and 225 designate delay circuits for establishing coordination with the latter stage processing. In addition, it includes AND circuits 226 and 228 whose input terminals are set to low active states, NOR circuits 227 and 229, a NAND circuit 230, and an AND circuit 231. Herein, the NOR circuits 227 and 229, and an inverter 242 connected to the output terminal of the NOR circuit 227 form the aforementioned RS flip-flop 207. The RS flip-flop 207 eliminates short-time pulses (or noise) from the PWM signal $N_3$.

Figure 3:
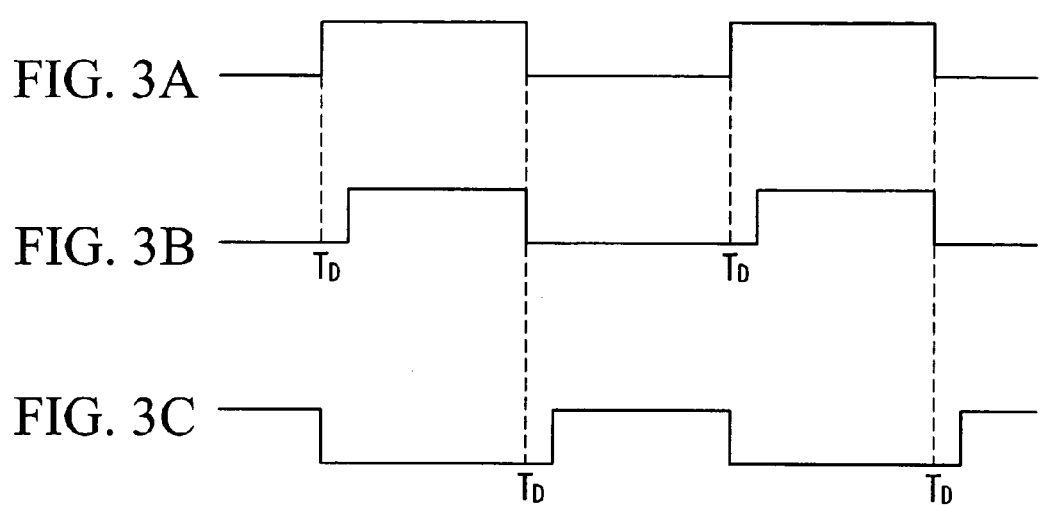
FIG. 3A shows a waveform representing a PWM signal input to a pulse isolation circuit shown in FIG. 2.
FIG. 3B shows a waveform of a high pulse signal output from the pulse isolation circuit.
FIG. 3C shows a waveform of a low pulse signal output from the pulse isolation circuit.
Figure 4:
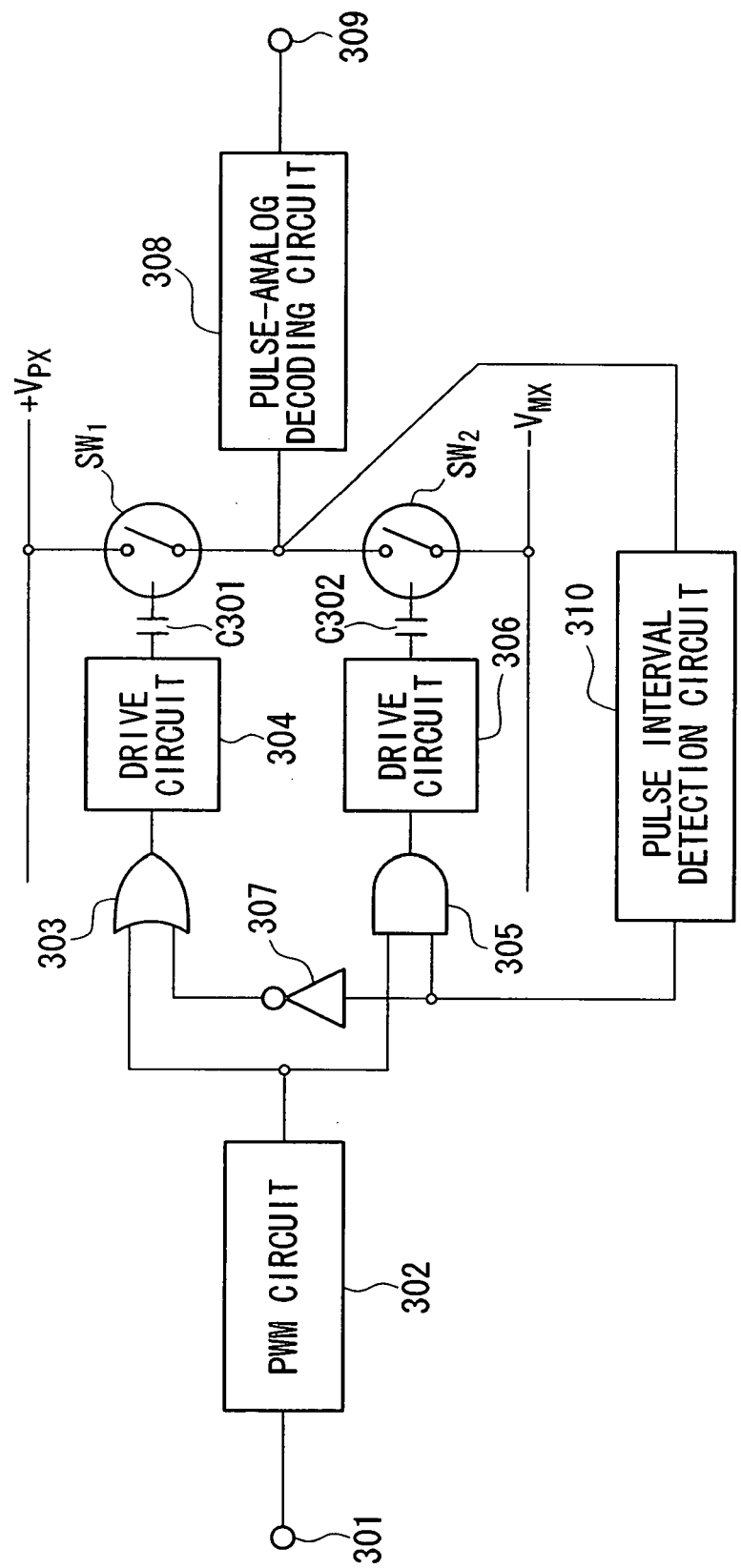
FIG. 4 is a block diagram showing a conventionally known class-D amplifier using pulse-width modulation.

FIGS. 3A to 3C show input and output waveforms of the pulse isolation circuit 204. Specifically, FIG. 3A shows the PWM signal input to the pulse isolation circuit 204; FIG. 3B shows a high pulse signal; and FIG. 3C shows a low pulse signal. In both of the high pulse signal and low pulse signal, the leading-edge timing of each pulse is subjected to subtraction using a prescribed dead time $T_D$.

The adjusting circuit 205 is constituted by a NAND circuit 232 and AND circuits 233 and 234. When both of the high pulse signal HIP and the low pulse signal LOP are simultaneously turned on due to failure of the former stage of the adjusting circuit 205, the adjusting circuit 205 operates to avoid the occurrence of such simultaneous ON condition by compulsorily reducing the level of the high pulse signal HIP to a low level.

The clipping detection circuit 206 is constituted by D-flip-flops 235-240 whose reset terminals are set to low active states, and a NOR circuit 241. The frequency of the clock pulse signal CK2 is double compared with the frequency of the triangular wave $N_2$ that is used as a carrier wave for pulse-width modulation. The clock pulse signal CK2 is delivered to the D flip-flops 235-240 via an inverter. Herein, the PWM signal $N_3$ is supplied to the reset terminals of the D flip-flops 238-240, while the PWM signal $N_3$ is inverted and is then supplied to the reset terminals of the D flip-flops 235-237.

In the above, all of the D flip-flops 235-240 operate upon detection of the trailing-edge timing of the clock pulse signal CK2, wherein the D flip-flops 235-237 form a shift register, and the D flip-flops 238-240 form another shift register. Outputs of the D flip-flops 237 and 240, which form the last stages of the aforementioned shift registers, are supplied to the NOR circuit 241. The D input terminals of the D flip-flops 235 and 238 are each fixedly set to a high level.

Upon the detection of a first trailing edge of the clock pulse signal CK2, when the PWM signal $N_3$ is at a high level, the D flip-flop 238 changes the output (Q) thereof from L to H. In response to the inversion of the output of the D flip-flop 238, the D flip-flop 239 starts to operate upon the detection of a second trailing edge of the clock pulse signal CK2, wherein when the PWM signal $N_3$ remains at a high level, it changes the output (Q) thereof from L to H. In response to the inversion of the output of the D flip-flop 239, the D flip-flop 240 operates similarly upon the detection of a third trailing edge of the clock pulse signal CK2, wherein when the PWM signal still remains at a high level, it changes the output (Q) thereof from L to H. When the PWM signal is at a low level, all of the D flip-flops 238 to 240 are initialized so that the outputs (Q) thereof are returned to L. As described above, when the PWM signal $N_3$ continuously remains at a high level during a prescribed time period corresponding to three consecutive clock pulses, i.e., during one and a half periods of the triangular wave $N_2$, the D flip-flop 240 changes the output (Q) thereof from L to H.

Upon the detection of a first trailing edge of the clock pulse signal CK2, when the PWM signal $N_3$ is at a low level, the D flip-flop 235 changes the output (Q) thereof from L to H. In response to the inversion of the output of the D flip-flop 235, the D flip-flop 236 operates upon the detection of a second trailing edge of the clock pulse signal CK2, wherein when the PWM signal $N_3$ remains at a low level, it changes the output (Q) thereof from L to H. In response to the inversion of the output of the D flip-flop 236, upon the detection of a third trailing edge of the clock pulse signal CK2, the D flip-flop 237 operates similarly, wherein when the PWM signal $N_3$ remains at a low level, it changes the output (Q) thereof from L to H. When the PWM signal $N_3$ is at a high level, all of the D flip-flops 235-237 are initialized so that the outputs (Q) thereof return to L. As described above, when the PWM signal $N_3$ continuously remains at a low level during a prescribed time period corresponding to three consecutive clock pulses, i.e., during one and a half periods of the triangular wave $N_2$, the D flip-flop 237 changes the output (Q) thereof from L to H.

The signal CLIPN output from the NOR circuit 241 is set to a low level when the output (Q) of the D flip-flop 237 or the D flip-flop 240 is at a high level (H), while it is set to a high level when both of the outputs (Q) of the D flip-flops 237 and 240 are set to a low level (L). This signal CLIPN is supplied to the switch SW$_3$ (see FIG. 1). That is, the switch SW$_3$ is turned on when the signal CLIPN is at a high level; and the switch SW$_3$ is turned off when the signal CLIPN is at a low level.

Figure 5A:
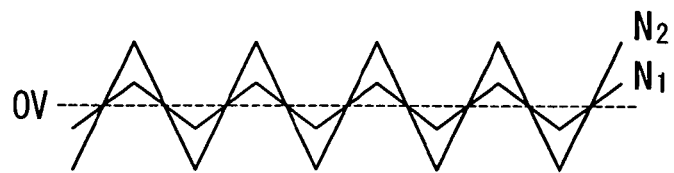
FIG. 5A shows the relationship between an analog input signal and a triangular wave in a non-clipping mode.
Figure 5B:
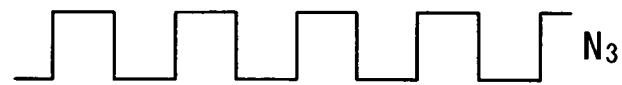
FIG. 5B shows a pulse-width modulated signal in relation to FIG. 5A.
Figure 5C:
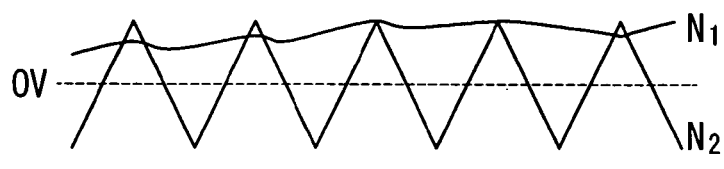
FIG. 5C shows the relationship between an analog input signal and a triangular wave in a clipping mode.
Figure 5D:
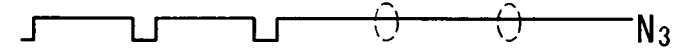
FIG. 5D shows a pulse-width modulated signal in relation to FIG. 5C.
Figure 6A:
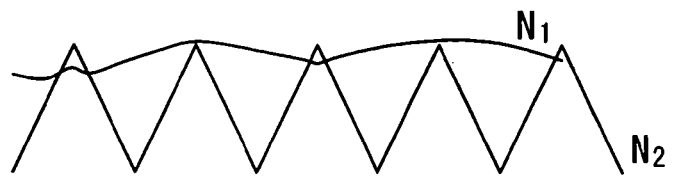
FIG. 6A shows the relationship between an analog input signal and a triangular wave in which a clipped state occurs per every other pulse.
Figure 6B:
FIG. 6B shows a pulse-width modulated signal in relation to FIG. 6A.

FIGS. 5A to 5D show slightly clipped states occurring in waveforms; and FIGS. 6A and 6B show a clipped state occurring per every other pulse.

Specifically, FIG. 5A shows the relationship between an analog input signal N$_1$ and a triangular wave N$_2$ after integration in a non-clipping mode; FIG. 5B shows a PWM signal N$_3$ in relation to FIG. 5A; FIG. 5C shows the relationship between an analog input signal N$_1$ and a triangular wave N$_2$ after integration in a clipping mode; and FIG. 5D shows a PWM signal N$_3$ in relation to FIG. 5C.

FIG. 6A shows the relationship between an analog input signal N$_1$ and a triangular wave N$_2$ in a clipping mode in which a clipped state occurs per every other pulse; and FIG. 6B shows a PWM signal N$_3$ in relation to FIG. 6A.

In FIG. 1, an analog input signal is normally subjected to secondary integration by the operational amplifier 102 so as to produce the waveform 'N$_1$' shown in FIG. 5A, whereby it is possible to improve noise characteristics. When the analog input signal does not have a large amplitude, pulse-width modulation may be appropriately performed as shown in FIGS. 5A and 5B. However, when the analog input signal is increased in amplitude so that the level of the 'integrated' analog input signal becomes close to the maximal value (or minimal value) of a triangular wave, clipped states may occur sporadically as shown in FIGS. 5C and 5D. Furthermore, there may occur a phenomenon in which a clipped state occurs per every other pulse.

In FIG. 1, the clipping detection circuit 206 (see FIG. 2) detects the occurrence of a first clipped state so as to control on/off signals to turn off the switch SW$_3$, whereby the connection point between the capacitors C$_2$ and C$_3$ is connected to the non-inverting input terminal of the operational amplifier 102 via a series circuit consisting of the resistors R$_2$ and R$_3$. Since the resistor R$_2$ is much larger than the resistor R$_3$, the integration constant of the operational amplifier 102 (which is initially identical to the secondary integration constant) is changed to be close to the primary integration constant; thus, it is possible to suppress the maximal value (or minimal value) of the 'amplified' analog input signal N$_1$.

As a result, it is possible to eliminate the "sporadically" clipped states shown in FIGS. 5C and 5D; in particular, it is possible to effectively inhibit the occurrence of a clipped state that occurs per every other pulse as shown in FIGS. 6A and 6B. In addition, the analog input signal has sufficiently great voltage level; hence, noise characteristics will not be degraded irrespective of the setup of the integration constant of the operational amplifier 102, which is set close to the primary integration constant. That is, the present embodiment can perform pulse-width modulation without discontinuity irrespective of the changeover of the order of the integration constant, wherein the aforementioned changeover does not substantially influence the operation of the feedback loop realized by the resistor R$_8$ or the operation of the feedback loop realized by the resistors R$_5$ and R$_6$ and the capacitor C$_5$. When the switch SW$_3$ is turned off, the resistance between the resistor R$_3$ and the non-inverting input terminal of the operational amplifier 102 does not become infinite but becomes identical to that of the resistor R$_2$; hence, it is possible to minimize influence of switching operation of the switch SW$_3$, which may be buffered.

Of course, it is possible to further modify the present embodiment in a variety of ways. For example, the clipping detection circuit and clipped state detection circuit can each be modified such that a rectification circuit is used to detect an instantaneous voltage of the 'amplified' analog input signal N$_1$; the instantaneous voltage is compared with the reference voltage corresponding to the maximal value or minimal value of the triangular wave N$_2$; and thus, a clipped state (or a previous state that may cause clipping) is detected when the instantaneous voltage exceeds or becomes very close to the maximal value or minimal value of the triangular wave N$_2$. The reference voltage can be set in advance or set to have a fixed value. For example, when the circuitry is designed such that the maximal value and minimal value of the triangular wave varies in response to the positive voltage V$_{PX}$ and the negative voltage V$_{MX}$, the detected values of these voltages V$_{PX}$ and V$_{MX}$ are reduced using a prescribed ratio so as to produce specific values substantially matching the maximal value and minimal value of the triangular wave with respect to the reference voltage.

2. Second Embodiment

Figure 7:
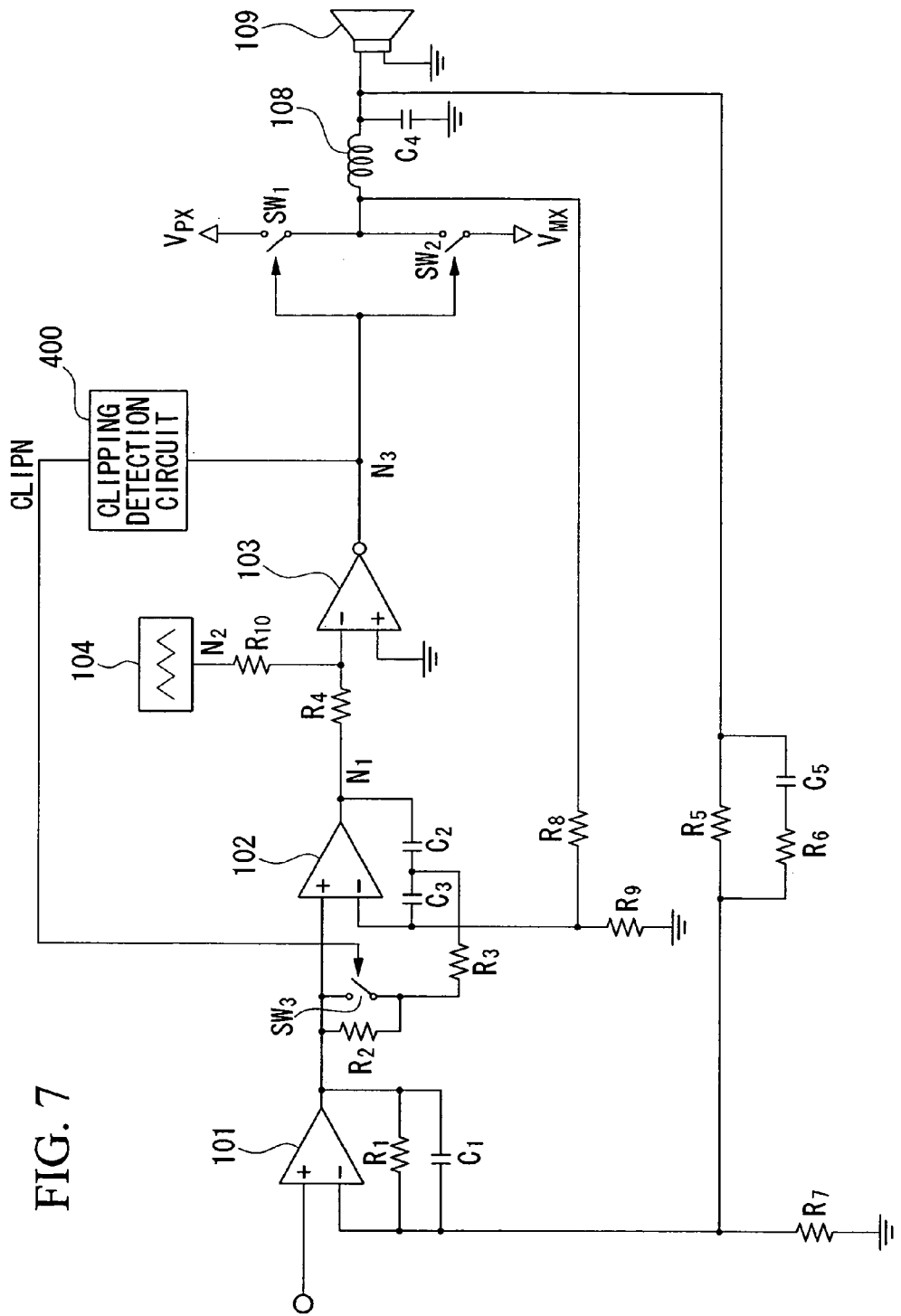
FIG. 7 is a block diagram showing the overall constitution of a class-D amplifier using pulse-width modulation in accordance with a second embodiment of the invention.

FIG. 7 is a block diagram showing the overall constitution of a class-D amplifier using pulse-width modulation in accordance with a second embodiment of the invention, wherein parts identical to those shown in FIG. 1 are designated by the same reference numerals; hence, the detailed description thereof will be omitted.

The second embodiment differs from the first embodiment that the digital processor 105 is replaced with a clipping detection circuit 400, and the PWM signal N$_3$ output from the operational amplifier 103 is directly applied to the switches SW$_1$ and SW$_2$ without the intervention of the drive circuits 106 and 107.

Figure 8:
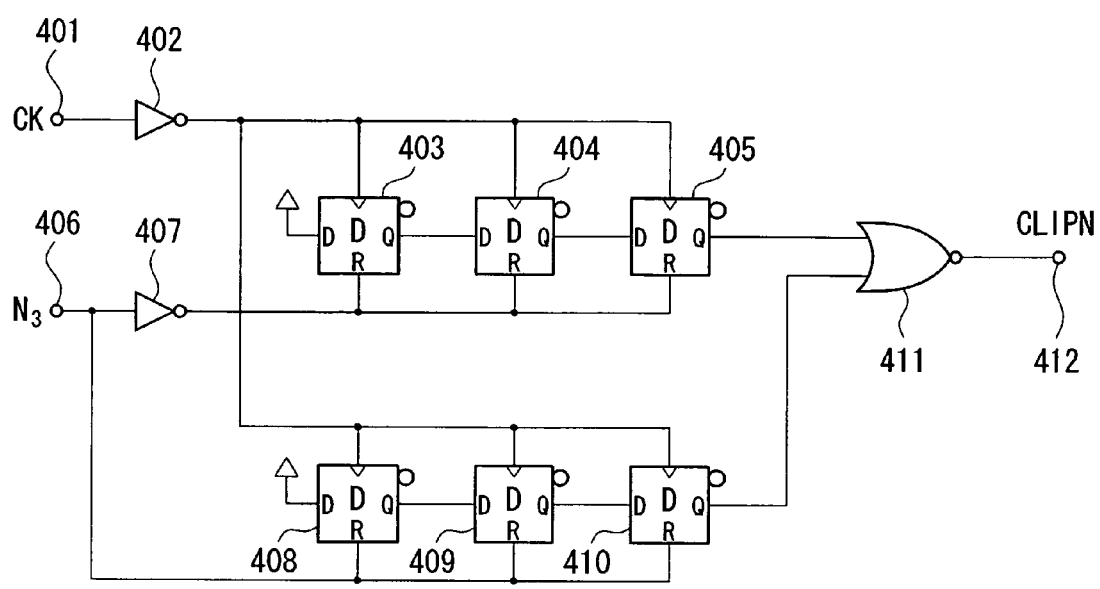
FIG. 8 is a circuit diagram showing the detailed constitution of a clipping detection circuit shown in FIG. 7.

FIG. 8 is a circuit diagram showing the detailed constitution of the clipping detection circuit 400 shown in FIG. 7. Reference numeral 401 designates an input terminal for inputting a clock pulse signal CK, which is used as a carrier wave for pulse-width modulation and whose frequency matches the frequency of a triangular wave N$_2$. The clock pulse signal CK is supplied to D flip-flops 403 to 405 and D flip-flops 408 to 410 via an inverter 402, wherein all of the D flip-flops 403-405 and 408-410 have reset terminals that are set to low active states. Reference numeral 406 designates an input terminal for inputting the PWM signal N$_3$. The PWM signal N$_3$ is supplied to reset terminals of the D flip-flops 408 to 410 respectively. In addition, the PWM signal N$_3$ is supplied to reset terminals of the D flip-flops 403 to 405 respectively via an inverter 407. Both of the D terminals of the D flip-flops 403 and 408 are fixed at a high level.

All of the D flip-flops 403-405 and the D flip-flops 408-410 operate upon the detection of the trailing edge timing of the clock pulse signal CK, wherein the D flip-flops 403-405 are combined together to form a shift register, and the D flip-flops 408-410 are combined together to form a shift register. Output terminals 'Q' of the D flip-flops 405 and 410, which form last stages of the shift registers, are connected to input terminals of a NOR circuit 411.

Upon the detection of a first trailing edge of the clock pulse signal CK, when the PWM signal N$_3$ is at a high level, the D flip-flop 408 inverts the output thereof from L to H. Due to such inversion of the output of the D flip-flop 408, upon the detection of a second trailing edge of the clock pulse signal CK, the D flip-flop 409 inverts the output thereof from L to H when the PWM signal $N_3$ is at a high level. Due to the inversion of the output of the D flip-flop 409 upon the detection of a third trailing edge of the clock pulse signal CK, the D flip-flop 410 operates similarly so as to invert the output thereof from L to H when the PWM signal $N_3$ is at a high level. When the PWM signal $N_3$ is at a low level, all of the D flip-flops are initialized so that their outputs return to L. That is, when the PWM signal $N_3$ is maintained at a high level during the consecutive three pulses of the clock pulse signal CK, i.e., during one and a half periods of the triangular wave $N_2$, the D flip-flop 410 inverts the output thereof from L to H. In contrast, when the PWM signal $N_3$ is maintained at a low level during the consecutive three pulses of the clock pulse signal CK, the D flip-flop 405 inverts the output thereof from L to H.

Upon the reception of the output H from the D flip-flop 405 or the D flip-flop 410, the NOR circuit 411 changes an output signal CLIPN to be at a low level. This indicates that the PWM signal $N_3$ output from the comparator 103 is maintained at a high level or a low level during one and a half periods of the triangular wave $N_2$; in other words, this indicates a clipped state of the PWM signal $N_3$. The output signal CLTPN is supplied to the switch $SW_3$ (see FIG. 7) via an output terminal 412. That is, the switch $SW_3$ is turned on when the signal CLIPN is at a high level, while the switch $SW_3$ is turned off when the signal CLTPN is at a low level.

The overall operation of the class-D amplifier shown in FIG. 7 is similar to that of the class-D amplifier shown in FIG. 1.

That is, when the clipping detection circuit 400 detects the occurrence of a clipped state, it changes the output signal CLIPN so as to turn off the switch $SW_3$, whereby the connection point between the capacitors $C_2$ and $C_3$ is connected to the inverting input terminal of the operational amplifier 102 via a series circuit consisting of the resisters $R_2$ and $R_3$. Since the resister $R_2$ is sufficiently larger than the resister $R_3$, the integration constant of the operational amplifier 102, which is originally close to the secondary integration constant, is changed to be close to the primary integration constant due to the establishment of the aforementioned connection, whereby it is possible to suppress the maximal value and minimal value of the 'amplified' analog input signal $N_1$.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A pulse-width modulation amplifier in which an analog input signal is subjected to pulse-width modulation and is then subjected to switched amplification, said pulse-width modulation amplifier comprising:
    a holding circuit for holding a pulse-width modulated signal;
    a control circuit for controlling the holding circuit to invert an output thereof when the pulse-width modulated signal is inverted in level and is sustained at an inverted level for a prescribed time; and
    a clipped state detection circuit for detecting a clipped state with respect to the pulse-width modulated signal, and a compulsory pulse introducing circuit for compulsorily introducing an inversion pulse whose pulse width is longer than the prescribed time into the pulse-width modulated signal when the clipped state is detected.

2. A pulse-width modulation amplifier according to claim 1, further comprising an integrator for integrating the analog input signal prior to the pulse-width modulation, and an integration constant changeover circuit for automatically changing over an integration constant adapted to the integrator to be reduced in order.

3. A pulse-width modulation amplifier according to claim 1, further comprising a pulse isolation circuit for isolating a high pulse signal and a low pulse signal from the pulse-width modulated signal output from the holding circuit, wherein each pulse included in the high pulse signal and the low pulse signal is delayed at a leading-edge timing thereof by a dead time.

4. A pulse-width modulation amplifier according to claim 2, further comprising a pulse isolation circuit for isolating a high pulse signal and a low pulse signal from the pulse-width modulated signal output from the holding circuit, wherein each pulse included in the high pulse signal and the low pulse signal is delayed at a leading-edge timing thereof by a dead time.

5. A pulse-width modulation amplifier in which an analog input signal is subjected to pulse-width modulation and is then subjected to switched amplification, said pulse-width modulation amplifier comprising:
    a holding circuit for holding a pulse-width modulated signal;
    a control circuit for controlling the holding circuit to invert an output thereof when the pulse-width modulated signal is inverted in level and is sustained at an inverted level for a prescribed time; and
    a pulse isolation circuit for isolating a high pulse signal and a low pulse signal from the pulse-width modulated signal output from the holding circuit, wherein each pulse included in the high pulse signal and the low pulse signal is delayed at a leading-edge timing thereof by a dead time.

6. A pulse-width modulation amplifier according to claim 5, further comprising an adjuster for compulsorily turning off one of the high pulse signal and the low pulse signal which are simultaneously set at a prescribed level.

7. A pulse-width modulation amplifier in which an analog input signal is subjected to pulse-width modulation and is then subjected to switched amplification, said pulse-width modulation amplifier comprising:
    a holding circuit for holding a pulse-width modulated signal;
    a control circuit for controlling the holding circuit to invert an output thereof when the pulse-width modulated signal is inverted in level and is sustained at an inverted level for a prescribed time;
    an integrator for integrating the analog input signal prior to the pulse-width modulation, a clipping detection circuit for detecting occurrence of clipping in the pulse-width modulation, and an integration constant changeover circuit for automatically changing over an integration constant adapted to the integrator to be reduced in order; and
    a pulse isolation circuit for isolating a high pulse signal and a low pulse signal from the pulse-width modulated signal output from the holding circuit, wherein each pulse included in the high pulse signal and the low pulse signal is delayed at a leading-edge timing thereof by a dead time.

8. A clipping suppression circuit adapted to a pulse-width modulation amplifier in which an analog input signal is subjected to integration, pulse-width modulation, and switched amplification, said clipping suppression circuit comprising:
- a monitoring circuit for monitoring inversion of a pulse-width modulated signal in synchronization with a half period of a carrier wave;
- a clipping detection circuit for determining occurrence of clipping when no inversion occurs in the pulse-width modulated signal during one and a half periods of the carrier wave; and
- an integration constant changeover circuit for changing over an integration constant to be reduced in order upon detection of the occurrence of clipping.

9. The clipping suppression circuit adapted to a pulse-width modulation amplifier according to claim 8, wherein the integration constant changeover circuit has a switching element, so that the integration constant is switched over by turning on or off the switching element.

10. The clipping suppression circuit adapted to a pulse-width modulation amplifier according to claim 8, wherein the pulse-width modulation amplifier includes an operational amplifier, a plurality of capacitors arranged between an inverting input terminal of the operational amplifier and an output terminal of the operational amplifier, and a first resistor connected between an non-inverting input terminal of the operational amplifier and one of the plurality of capacitors.

11. The clipping suppression circuit adapted to a pulse-width modulation amplifier according to claim 10, wherein the integration constant changeover circuit has a switching element connected between the first resistor and the non-inverting input terminal of the operational amplifier, so that the integration constant is changed over by turning on or off the switching element.

12. The clipping suppression circuit adapted to a pulse-width modulation amplifier according to claim 11, wherein a second resistor is connected in parallel with the switching element.

* * * * *